(12) United States Patent
Lin

(10) Patent No.: US 7,839,462 B2
(45) Date of Patent: Nov. 23, 2010

(54) PIXEL STRUCTURE OF LIQUID CRYSTAL DISPLAY PANEL AND METHOD OF MAKING THE SAME

(75) Inventor: Hsiang-Lin Lin, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 336 days.

(21) Appl. No.: 12/204,809

(22) Filed: Sep. 5, 2008

(65) Prior Publication Data

US 2009/0251628 A1 Oct. 8, 2009

(30) Foreign Application Priority Data

Apr. 8, 2008 (TW) .............................. 97112635 A

(51) Int. Cl.
*G02F 1/136* (2006.01)
*G02F 1/343* (2006.01)

(52) U.S. Cl. .......................................... 349/47; 257/72

(58) Field of Classification Search .................... 349/47
See application file for complete search history.

(56) References Cited

U.S. PATENT DOCUMENTS

| 6,069,678 A | 5/2000 | Sakamoto |
| 7,220,994 B2 | 5/2007 | Kim |
| 7,362,389 B2 * | 4/2008 | Yang et al. ..................... 349/38 |
| 2005/0213002 A1 * | 9/2005 | Wen et al. .................... 349/114 |

* cited by examiner

*Primary Examiner*—Mark A Robinson
*Assistant Examiner*—Mary A El Shammaa
(74) *Attorney, Agent, or Firm*—Winston Hsu; Scott Margo

(57) ABSTRACT

A pixel structure of a liquid crystal display panel and the method thereof is provided. The gate electrode and data line of the pixel structure are formed by a first patterned conductive layer, the scan line is formed by a second patterned conductive layer, and the common electrode and the pixel electrode are formed on a substrate. The common electrode, the pixel electrode, and the insulating layer disposed therebetween compose a storage capacitor. Also, the pixel or the common electrode has a slit structure.

14 Claims, 17 Drawing Sheets

PIXEL STRUCTURE OF LIQUID CRYSTAL DISPLAY PANEL AND METHOD OF MAKING THE SAME

BACKGROUND OF THE INVENTION

1. Field of the Invention

The present invention relates to a pixel structure of a liquid crystal display panel and method of making the same, and more particularly, to a pixel structure of a wild viewing angle liquid crystal display panel and method of making the same.

2. Description of the Prior Art

As the requirement of flat TVs increases, liquid crystal displays (LCDs) have become the most popular product in flat TV market. In particular, wild viewing angle LCD is a critical technique to develop in LCD industry. Please refer to FIGS. 1-2. FIGS. 1-2 illustrate a conventional pixel structure of an LCD panel, where FIG. 1 is a top view of the pixel structure, and FIG. 2 is a cross-sectional view of the pixel structure shown in FIG. 1 along a tangent line AA'. As shown in FIGS. 1-2, the conventional pixel structure of an LCD panel includes a substrate 10 having a switch device region 12, a display region 13 and a peripheral region 14 defined thereon. In the switch device region 12 disposes a thin film transistor, which includes a semiconductor layer. The semiconductor layer includes a channel region 16, a source region 18 and a drain region 20 disposed on two opposite sides of the channel region 16, and two lightly doped drains (LDDs) 22. One LDD 22 is disposed between the source region 18 and the channel region 16, and the other LDD 22 is disposed between the drain region 20 and the channel region 16.

The semiconductor layer is covered with a first insulating layer 24, and a first patterned conductive layer is disposed on the first insulating layer 24. The first patterned conductive layer includes a scan line 26 disposed in the peripheral region 14, and a gate electrode 28 disposed in the switch device region 12 and electrically connected to the scan line 26. The first insulating layer 24 and the first patterned conductive layer are covered with a second insulating layer 30, and a second patterned conductive layer is disposed on the second insulating layer 30. The second patterned conductive layer includes a data line 32 disposed in the peripheral region 14, and a drain pad 34 disposed in the switch device region 12. The second insulating layer 30 and the first insulating layer 24 expose the source region 18 and the drain region 20, so that the data line 32 may be electrically connected to the source region 18, and the drain pad 34 may be electrically connected to the drain region 20.

The prior art pixel structure includes a third insulating layer 36, a common electrode 38, a fourth insulating layer 40, and a pixel electrode 42. The third insulating layer 36 is disposed on the second insulating layer 30, the data line 32 and the drain pad 34. The common electrode 38 is disposed on the third insulating layer 36. The fourth insulating layer 40 is disposed on the common electrode 38 and the third insulating layer 36. The pixel electrode 42 is disposed on the fourth insulating layer 40, and electrically connected to the drain pad 34.

The conventional pixel electrode of an LCD panel, however, suffers from the following drawbacks. The common electrode 38 and the data line 32 are made of different material layers, and therefore require the third insulating layer 36 of a quite large thickness disposed therebetween to avoid shot-circuiting. This extra insulating layer increases the process complexity, and influences the transparency of the LCD panel.

In case the third insulating layer 36 is omitted, the data line 32 and the common electrode 38 formed subsequent to the data line 32 are in the same level. In such a case, the distance between the data line 32 and the common electrode 38 must be large enough to avoid short-circuiting, but this large distance between the data line 32 and the common electrode 38 reduces the aperture ratio.

SUMMARY OF THE INVENTION

It is therefore one of the objectives of the claimed invention to provide a pixel structure of a liquid crystal display panel and method of making the same to simplify the structure and the process of pixel structure.

According to the claimed invention, a pixel structure of a liquid crystal display panel is provided. The pixel structure of the liquid crystal display panel is formed on a substrate, which includes a switch device region, a display region, and a peripheral region. The pixel structure includes a semiconductor layer disposed in the switch device region of the substrate, a first insulating layer disposed on the substrate, a first patterned conductive layer disposed on the first insulating layer, a second insulating layer disposed on the first insulating layer, a gate electrode and a data line, a second patterned conductive layer disposed on the second insulating layer, and a liquid crystal driving electrode structure disposed in the display region. The semiconductor layer includes a channel region, and a source region and a drain region disposed on two opposite sides of the channel region respectively. The first insulating layer covers the semiconductor layer and having two openings which expose the source region and the drain region respectively. The first patterned conductive layer includes a gate electrode disposed on the first insulating layer and corresponding to the channel region of the semiconductor layer in the switch device region, and a data line disposed on the first insulating layer in the peripheral region, wherein a surface of the gate electrode includes a scan line connection region, and a surface of the data line includes a source connection region. The second insulating layer has four openings which expose the source region, the drain region, the scan line connection region of the gate, and the source connection region of the data line, respectively. The second patterned conductive layer includes a data line connection electrode electrically connected to the source region and the source connection region of the data line through the openings of the first insulating layer and the second insulating layer, a scan line electrically connected to the scan line connection region of the gate through the opening of the second insulating layer, and a drain pad electrically connected to the drain region through the openings of the first insulating layer and the second insulating layer. The liquid crystal driving electrode structure disposed on the second insulating layer includes a common electrode, a pixel electrode and a third insulating layer, wherein the pixel electrode is extended to the switch device region and electrically connected to the drain region through the drain pad.

According to the claimed invention, a method of forming a pixel structure of a liquid crystal display panel is provided. The method includes the following steps. A substrate having a switch device region, a display region, and a peripheral region defined thereon is provided. The substrate includes a semiconductor layer disposed in the switch device region of the substrate, a source region and a drain region disposed on two opposite sides of the semiconductor layer respectively, and a first insulating layer disposed on the substrate. The first insulating layer covers the semiconductor layer and has two openings which expose the source region and the drain region respectively. Subsequently, a first patterned conductive layer is formed on the first insulating layer. The first patterned conductive layer includes a gate electrode disposed on the first insulating layer and corresponding to the semiconductor layer in the switch device region, and a data line disposed on the first insulating layer in the peripheral region, wherein a surface of the gate electrode includes a scan line connection region, and a surface of the data line includes a source connection region. A second insulating layer is formed on the first insulating layer, the gate electrode and the data line, and four openings exposing the source region, the drain region, the scan line connection region of the gate, and the source connection region of the data line are formed. A second patterned conductive layer is then formed on the second insulating layer. The second patterned conductive layer includes a data line connection electrode electrically connected to the source region and the source connection region of the data line through the openings of the first insulating layer and the second insulating layer, a scan line electrically connected to the scan line connection region of the gate through the opening of the second insulating layer, and a drain pad electrically connected to the drain region through the openings of the first insulating layer and the second insulating layer. A liquid crystal driving electrode structure is formed on the second insulating layer of the display region, wherein the liquid crystal driving electrode structure includes a common electrode, a third insulating layer and a pixel electrode, and the pixel electrode is extended to the switch device region for electrically connecting to the drain region through the drain pad.

The pixel structure of the present invention uses the first patterned conductive layer as the data line, the second patterned conductive layer as the scan line, and forms the common electrode on the substrate. Therefore, the pixel structure requires only three insulating layers. This simplifies the structure and process, and improves the light transmission.

These and other objectives of the present invention will no doubt become obvious to those of ordinary skill in the art after reading the following detailed description of the preferred embodiment that is illustrated in the various figures and drawings.

DETAILED DESCRIPTION

In the below described embodiments of the present invention, a pixel structure of a fringe-field switching (FFS) LCD panel is exemplarily illustrated, but not limited. The present invention may be used to other suitable types of display panels. Also, like elements are denoted by like numerals for highlighting the differences between different embodiments.

Figure 1:
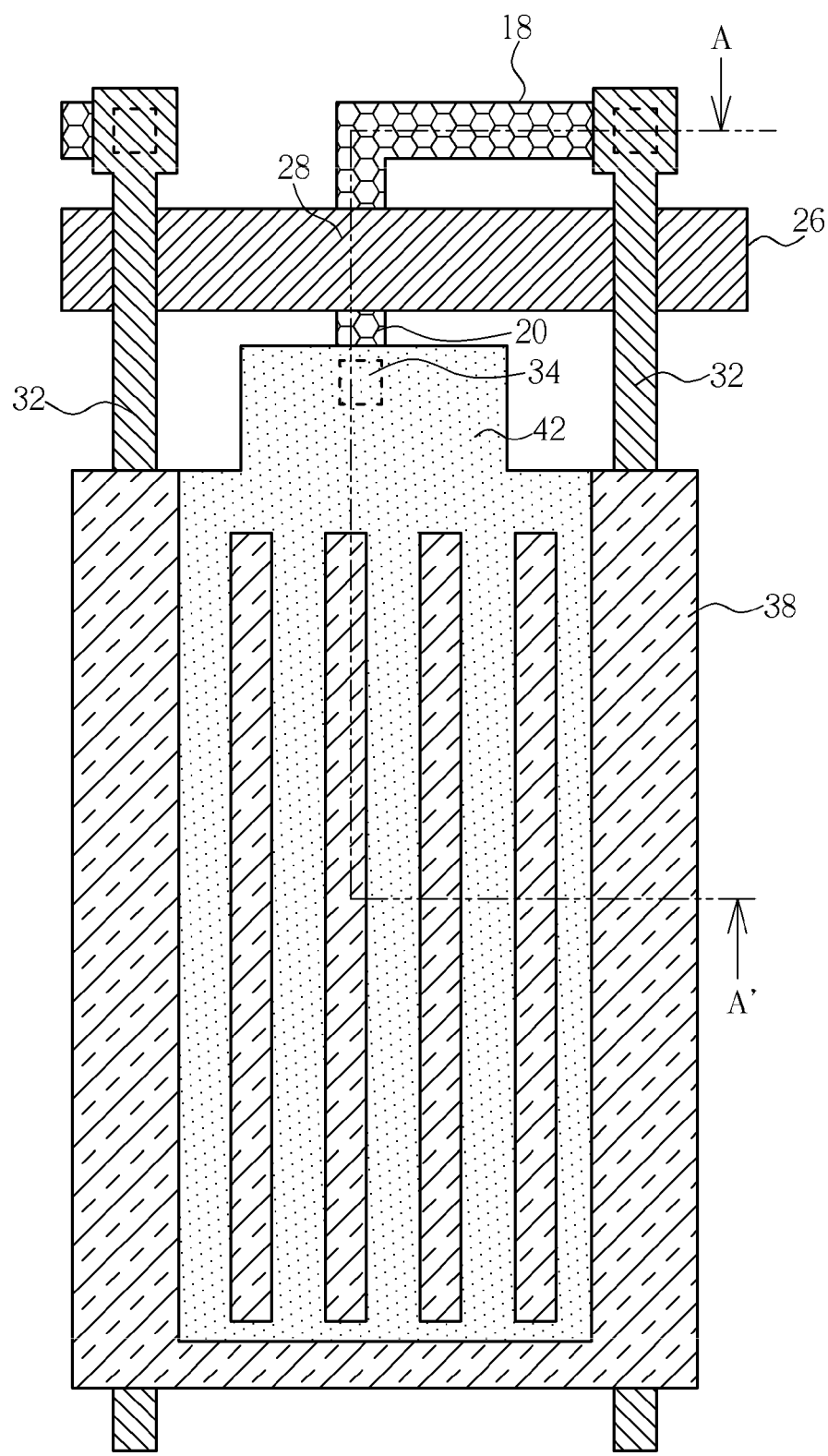
FIGS. 1-2 illustrate a conventional pixel structure of an LCD panel.
Figure 2:
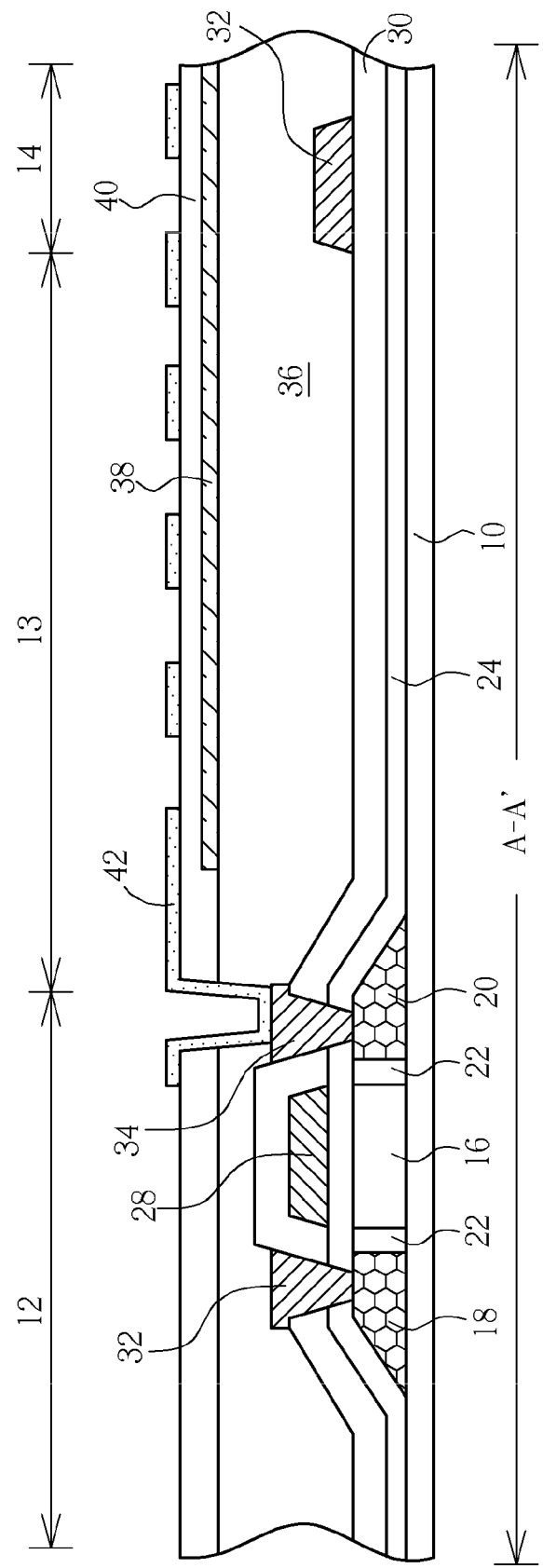
Figure 3:
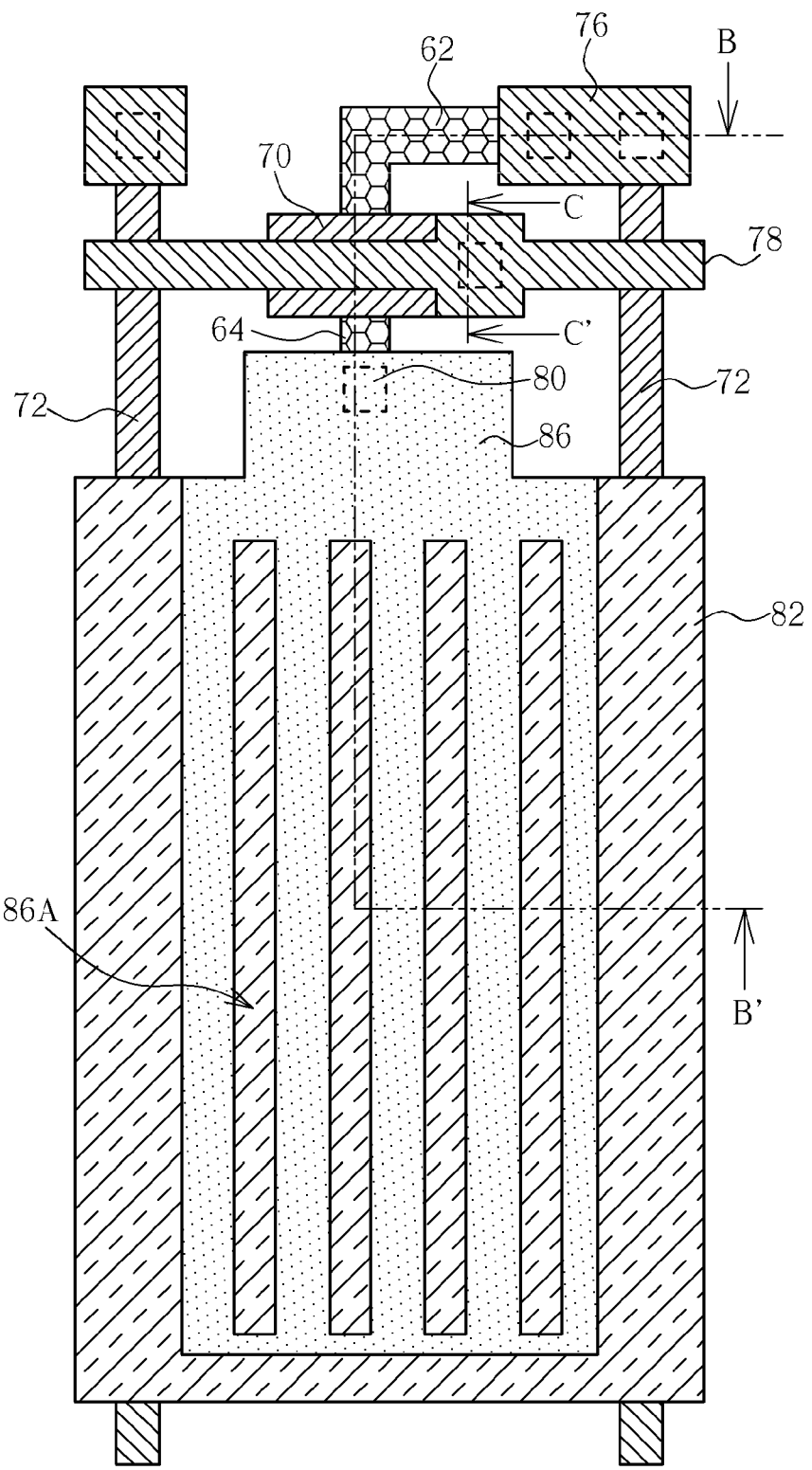
FIGS. 3-4 illustrate a pixel structure of an LCD panel in accordance with a preferred embodiment of the present invention.
Figure 4:
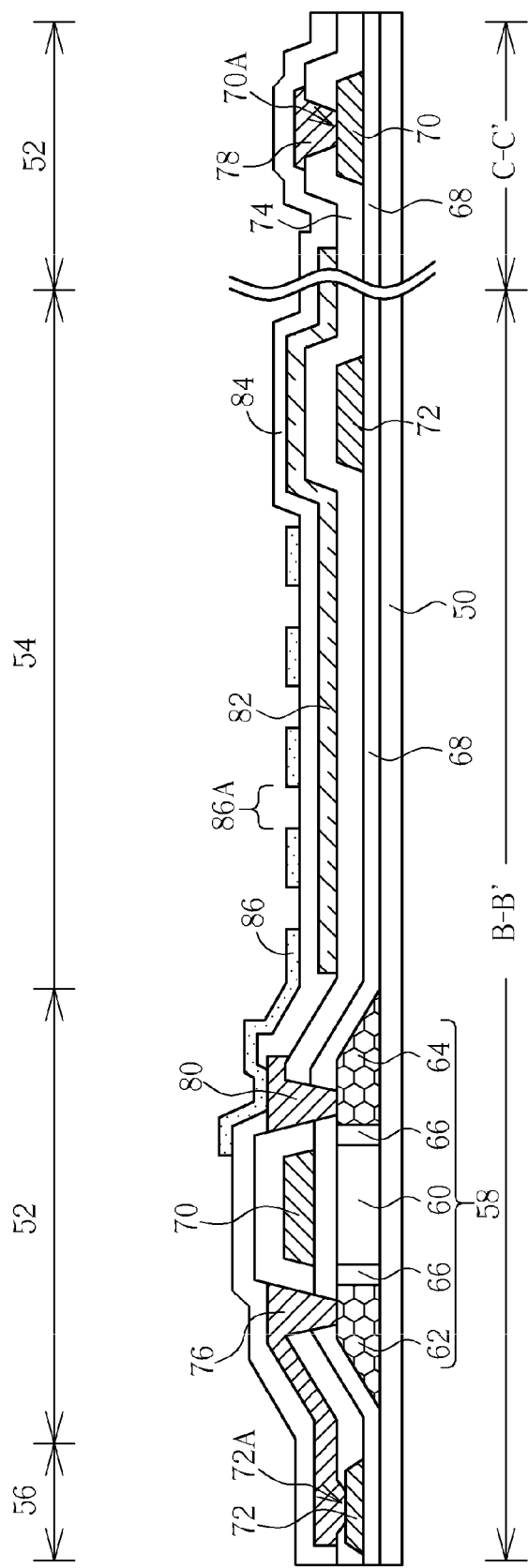

Please refer to FIGS. 3-4. FIGS. 3-4 illustrate a pixel structure of an LCD panel in accordance with a preferred embodiment of the present invention, where FIG. 3 is a top view of the pixel structure, and FIG. 4 is a cross-sectional view of the pixel structure of FIG. 3 along tangent lines BB' and CC'. In this embodiment, the pixel structure is disposed on a substrate 50, and the substrate 50 includes a switch device region 52, a display region 54, and a peripheral region 56 defined thereon. The above pixel structure includes a semiconductor layer 58 disposed in the switch device region 52 of the substrate 50. The semiconductor layer 58 includes a channel region 60, and a source region 62 and a drain region 64 disposed on two opposite sides of the channel region 60, respectively. Further, two LDDs 66 are disposed respectively between the source region 62 and the channel region 60, and between the drain region 64 and the channel region 60. In addition, the pixel structure further includes a first insulating layer 68, which covers the semiconductor layer 58 and the substrate 50, but has two openings exposing the source region 62 and the drain region 64 respectively.

A first patterned conductive layer is disposed on the first insulating layer 68, and the first patterned conductive layer includes a gate electrode 70 corresponding to the channel region 60 of the semiconductor layer 58 in the switch device region 52, and a data line 72 disposed in the peripheral region 56. The surface of the gate electrode 70 has a scan line connection region 70A for electrically connecting to a scan line, and the surface of the data line 72 has a source connection region 72A for electrically connecting to a source. The first insulating layer 68, the gate electrode 70 and the data line 72 of the first patterned conductive layer are covered with a second insulating layer 74, which has four openings exposing the source region 62, the drain region 64, the scan line connection region 70A of the gate electrode 70, and the source connection region 72A of the data line 72 respectively. In addition, a second patterned conductive layer is disposed on the second insulating layer 74, and the second patterned conductive layer includes a data line connection electrode 76 disposed in the switch device region 52, a scan line 78 disposed in the peripheral region 56, and a drain pad 80 disposed in the switch device region 52. The data line connection electrode 76 is electrically connected to the source region 62 and the source connection region 72A of the data line 72 through the openings of the first insulating layer 68 and the second insulating layer 74, and thus the data line 72 is able to electrically connect to the source region 62. The scan line 78 is in contact with the scan line connection region 70A of the gate electrode 70 through the opening of the second insulating layer 74, thereby electrically connecting to the gate electrode 70. The drain pad 80 is filled into the openings of the first insulating layer 68 and the second insulating layer 74, and disposed on the drain region 64 so that the drain pad 80 is electrically connected to the drain region 64.

The pixel structure of this embodiment further includes a liquid crystal (LC) driving electrode structure disposed in the display region 54. The LC driving electrode structure includes a common electrode 82 disposed on the second insulating layer 74, a third insulating layer 84 disposed on the common electrode 82 and the second insulating layer 74, and a pixel electrode 86 disposed on the third insulating layer 84. The common electrode 82 and the pixel electrode 86 are both transparent electrodes e.g. indium tin oxide (ITO) electrodes. The third insulating layer 84 has an opening exposing the drain pad 80, and the pixel electrode 86 is extended to the switch device region 52 and in contact with the drain pad 80. Accordingly, the pixel electrode 86 is electrically connected to the drain region 64 through the drain pad 80. In addition, the pixel electrode 86 includes a plurality of slits 86A and the pixel electrode 86 and the data line 72 are not overlapping.

The common electrode 82, which has an intact surface in the display region 54, is partially overlapping with the pixel electrode 86, and therefore the common electrode 82, the pixel electrode 86, and the third insulating layer 84 disposed therebetween compose a storage capacitor. Furthermore, the common electrode 82 crosses through the data line 72, and therefore the common electrode 82 and the data line 72 are partially overlapping.

Figure 5:
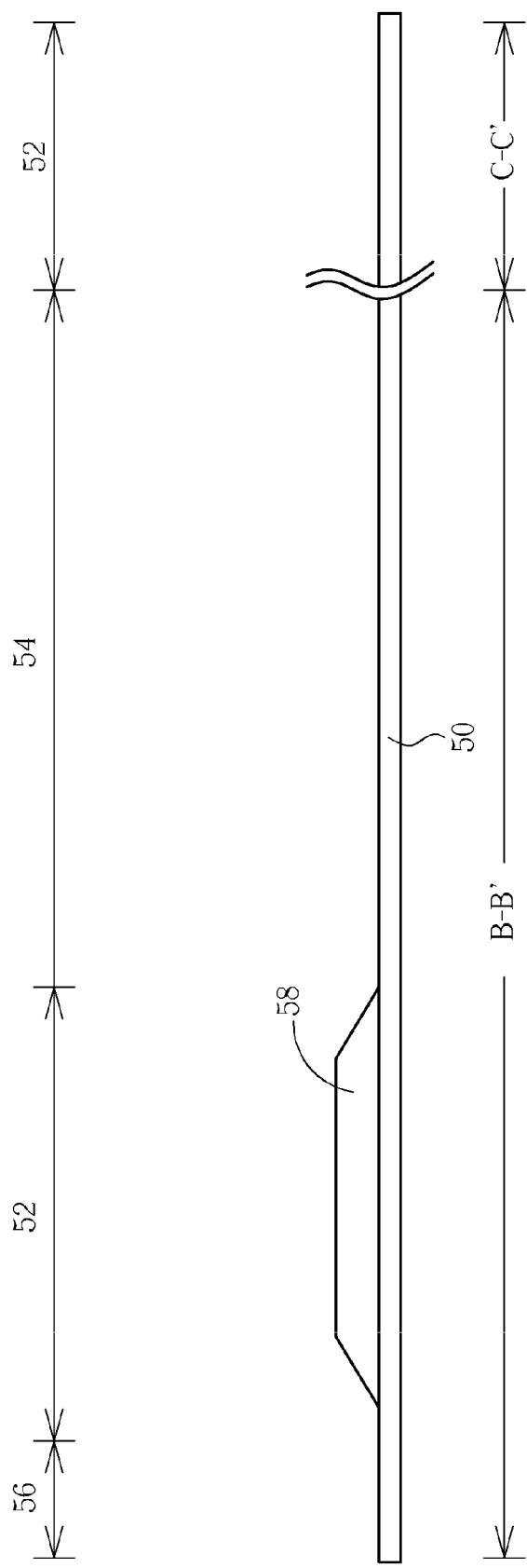
FIGS. 5-12 are schematic diagrams illustrating a method of forming a pixel structure of the above embodiment.

Please refer to FIGS. 5-12. FIGS. 5-12 are schematic diagrams illustrating a method of forming a pixel structure of the above embodiment. As shown in FIG. 5, a substrate 50 is provided. The substrate 50 has a switch device region 52, a display region 54, and a peripheral region 56 defined thereon. Then, a semiconductor layer 58, e.g. a low temperature polycrystalline silicon (LTPS) layer, is formed on the substrate 50, and the semiconductor layer 58 is patterned and defined in the switch device region 52 by photolithographic and etching techniques.

Figure 6:
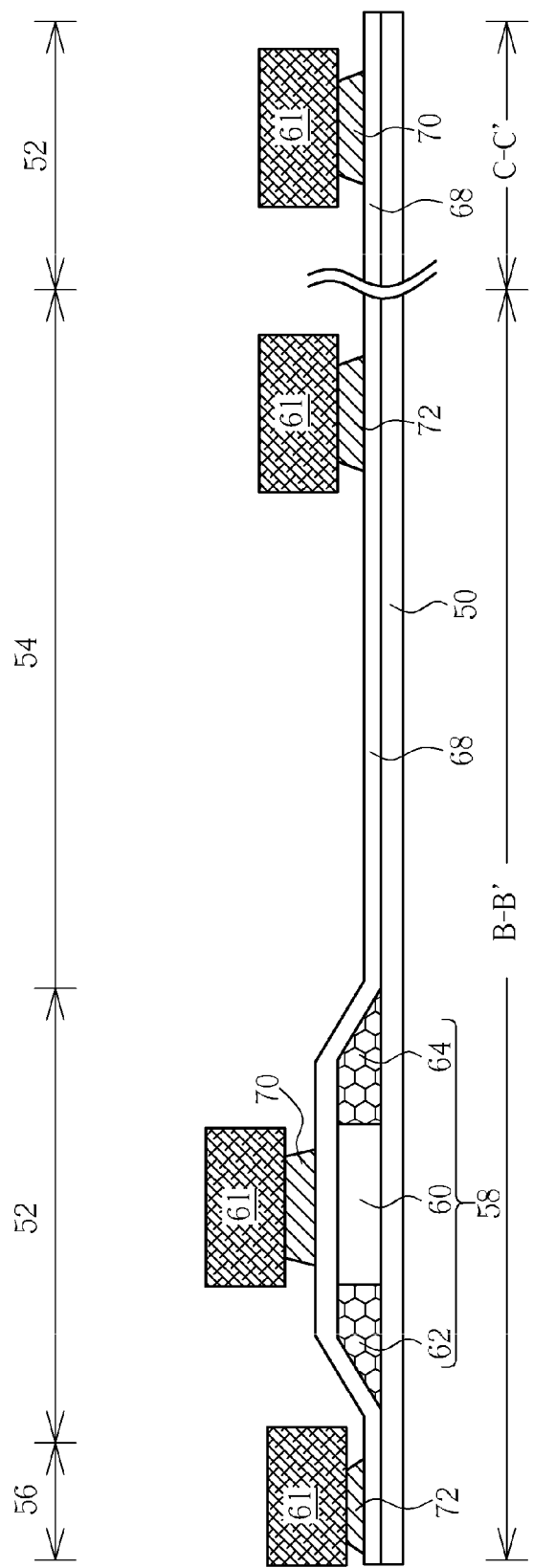

As shown in FIG. 6, a first insulating layer 68 such as silicon oxide, silicon nitride or silicon oxynitride is formed on the substrate 50 and the semiconductor layer 58, and a first conductive layer (not shown) e.g. a metal layer is formed on the first insulating layer 68. Subsequently, a photoresist pattern 61 is formed on the first conductive layer, and an etching process using the photoresist pattern 61 as an etching mask is carried out to partially remove the first conductive layer, and therefore to define a first patterned conductive layer. The first patterned conductive layer includes a gate electrode 70 disposed in the switch device region 52, and a data line 72 disposed in the peripheral region 56. The surface of the gate electrode 70 has a scan line connection region 70A, and the surface of the data line 72 has a source connection region 72A. In addition, the semiconductor layer 58 corresponding to the gate electrode 70 serves as a channel region 60, and the first insulating layer 68 sandwiched between the gate electrode 70 and the channel region 60 serves as a gate insulating layer. In this embodiment, the thin film transistor has LDD design, and thus the process parameters in etching of the first conductive layer are modified to provide lateral etching effect. The lateral etching renders the dimension of the gate electrode 70 slightly smaller than the dimension of the photoresist pattern 61. Subsequently, a high concentration implantation process using the photoresist pattern 61 as a mask is carried out to form a source region 62 and a drain region 64 in the semiconductor layer 58 on two opposite sides of the gate electrode 70. It is appreciated that the method is not limited by this embodiment.

Figure 7:
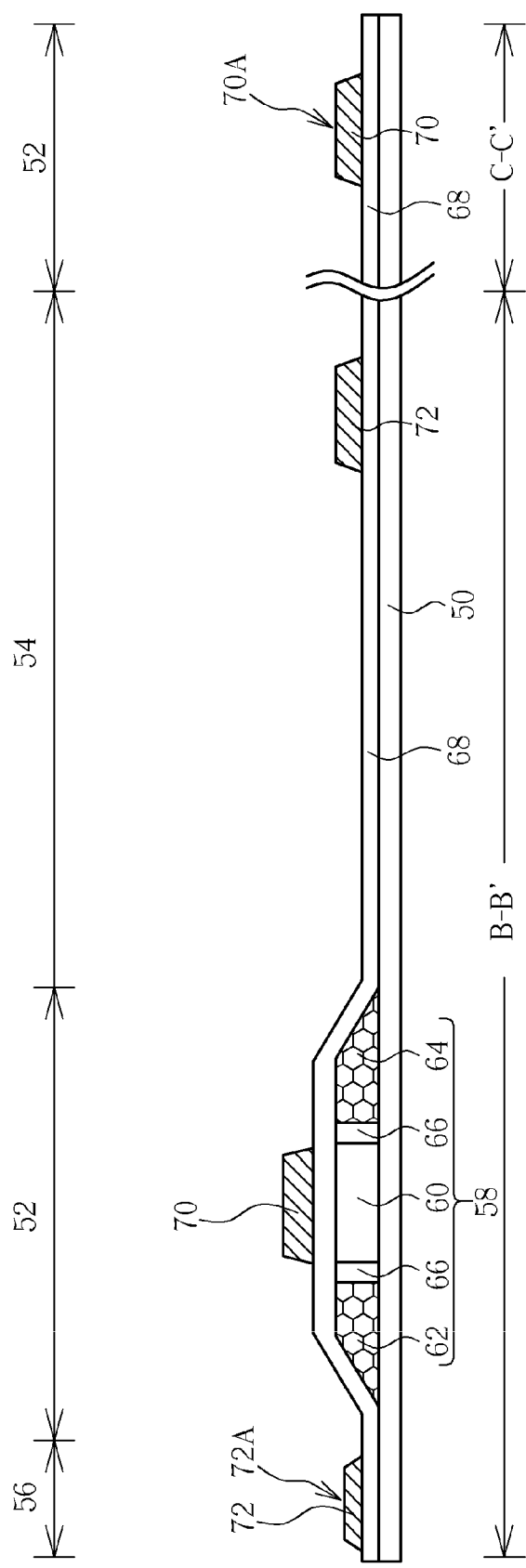
Figure 8:
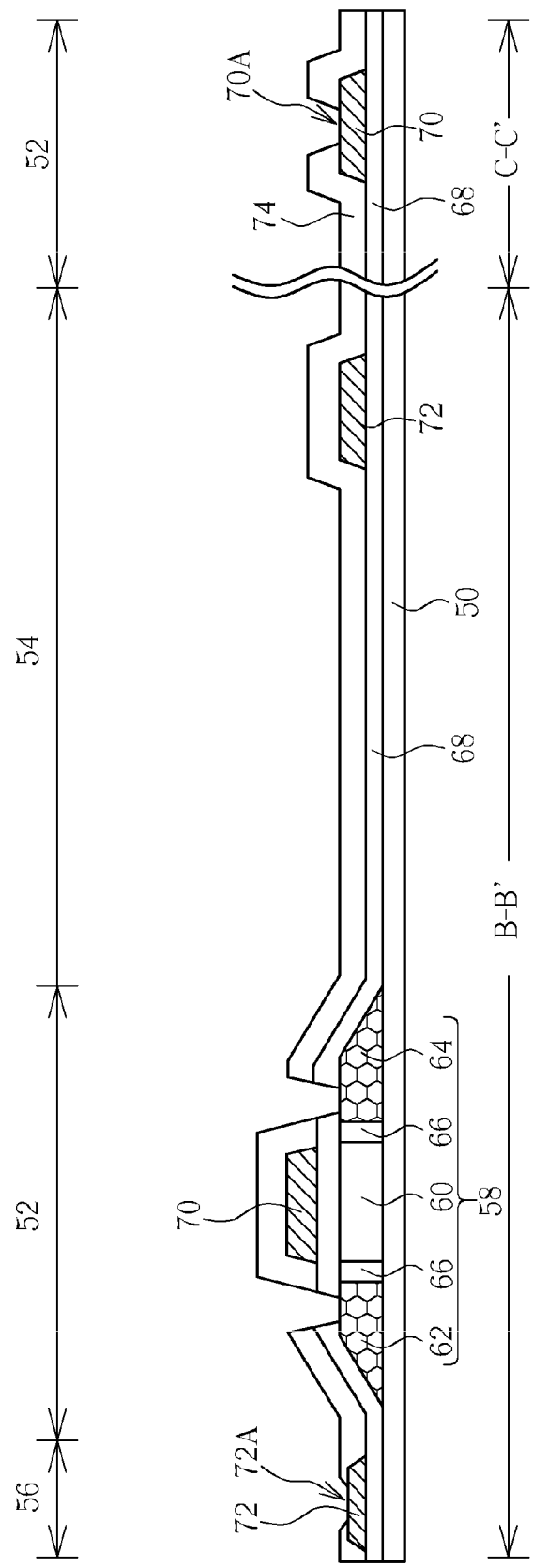

As shown in FIG. 7, the photoresist pattern 61 is stripped, and a low concentration implantation process is implemented to form two LDDs 66 between the source region 62 and the channel region 60, and between the drain region 64, respectively. As shown in FIG. 8, a second insulating layer 74 is formed on the first insulating layer 68, the gate electrode 70 and the data line 72, and the second insulating layer 74 is partially removed by photolithographic and etching techniques to form four openings. These four openings expose the source region 62, the drain region 64, the scan line connection region 70A of the gate electrode 70, and the source connection region 72A of the data line 72.

Figure 9:
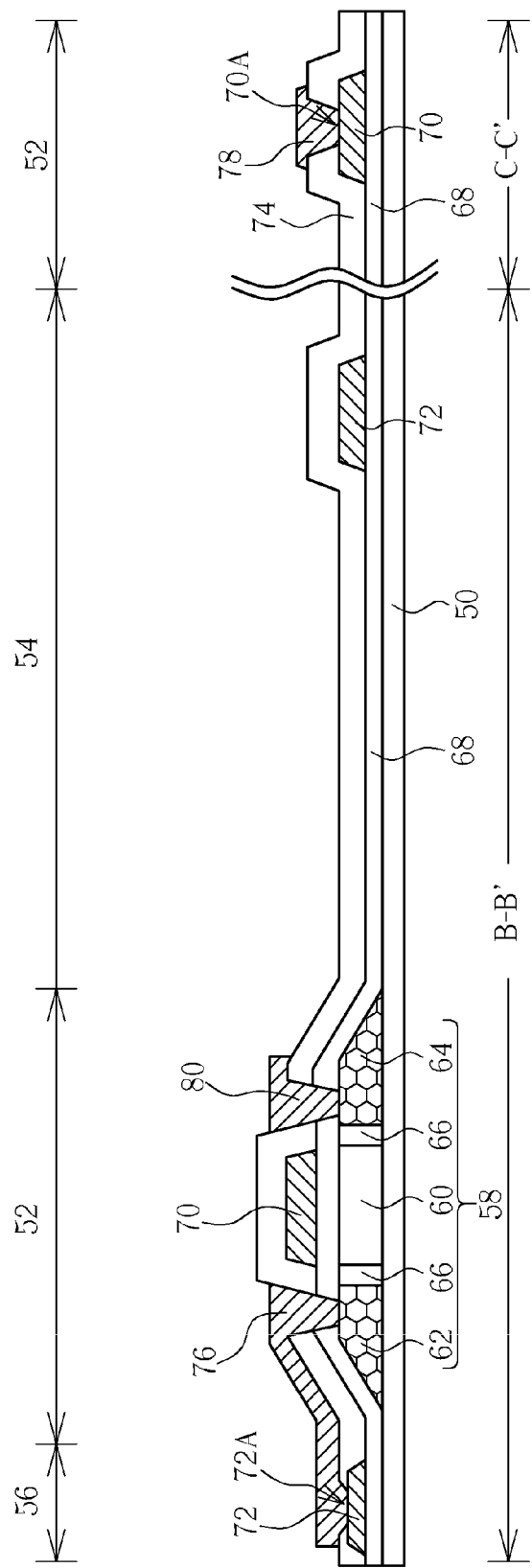

As shown in FIG. 9, a second conductive layer (not shown) e.g. a metal layer is formed on the second insulating layer 74, and the second conductive layer is then patterned by photolithographic and etching techniques to form a second patterned conductive layer. The second patterned conductive layer includes a data line connection electrode 76 disposed in the switch device region 52 and in the peripheral region 56, a scan line 78 disposed in the peripheral region 56, and a drain pad 80 disposed in the switch device region 52. The data line connection electrode 76 is electrically connected to the source region 62 and the source connection region 72A of the data line 72 through the openings of the first insulating layer 68 and the second insulating layer 74. The scan line 78 is electrically connected to the scan line connection region 70A of the gate electrode 70 through the opening of the second insulating layer 74. The drain pad 80 is filled into the openings of the first insulating layer 68 and the second insulating layer 74 with respect to the drain region 64, and electrically connected to the drain region 64.

Figure 10:
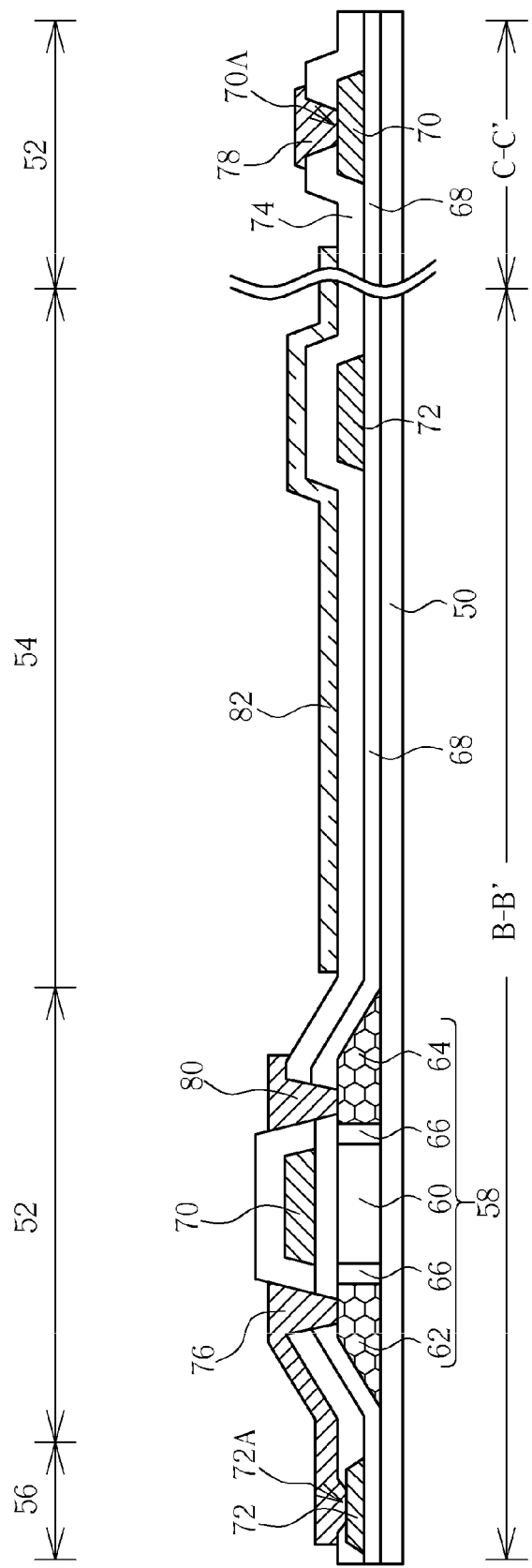
Figure 11:
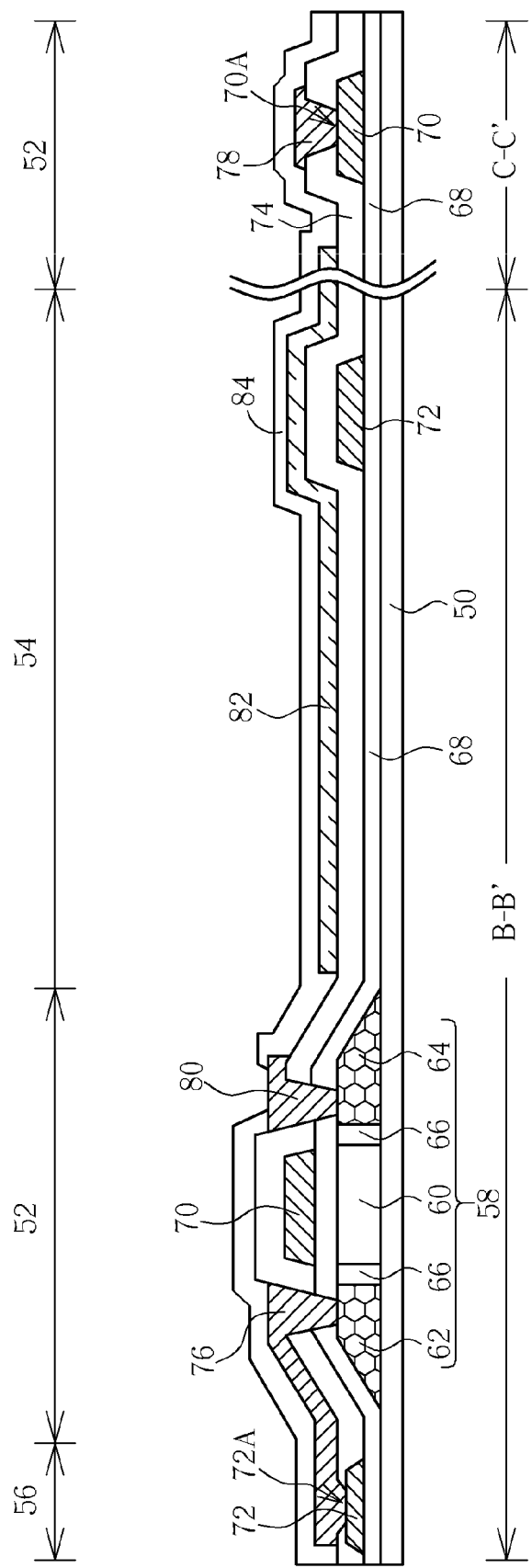
Figure 12:
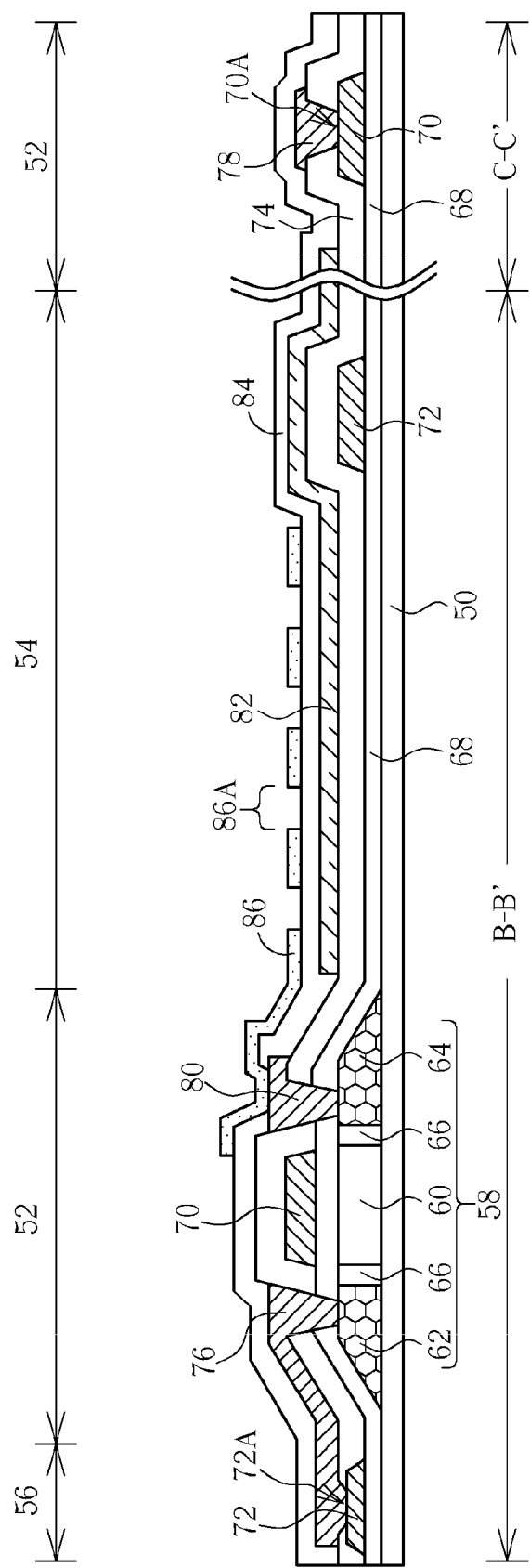

The fabrication of the LC driving electrode structure is followed. As shown in FIG. 10, a common electrode 82 is formed on the second insulating layer 74 in the display region 54. The common electrode 82 are transparent materials e.g. ITO. As shown in FIG. 11, a third insulating layer 84 is formed on the second insulating layer 74 and the common electrode 82, and an opening with respect to the drain pad 80 is formed to expose the drain pad 80. As shown in FIG. 12, a pixel electrode 86 is formed on the third insulating layer 84, and electrically connected to the drain pad 80 through the opening of the third insulating layer 84. The pixel electrode 86 is partially removed by photolithographic and etching techniques to form a plurality of slits 86A. The material of the pixel electrode 86 is transparent e.g. ITO.

Figure 13:
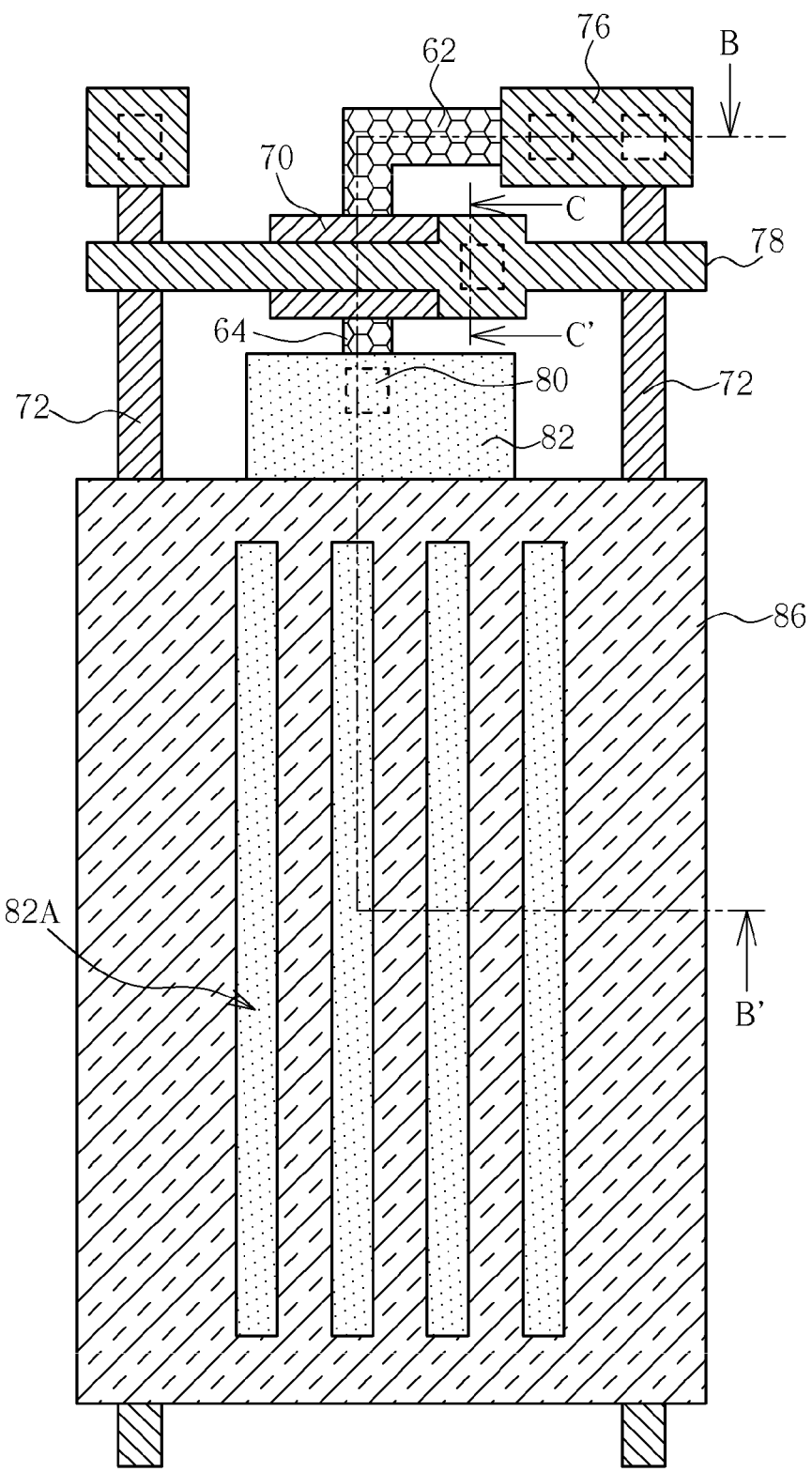
FIGS. 13-14 are schematic diagrams illustrating of a pixel structure of an LCD panel according to another embodiment of the present invention.
Figure 14:
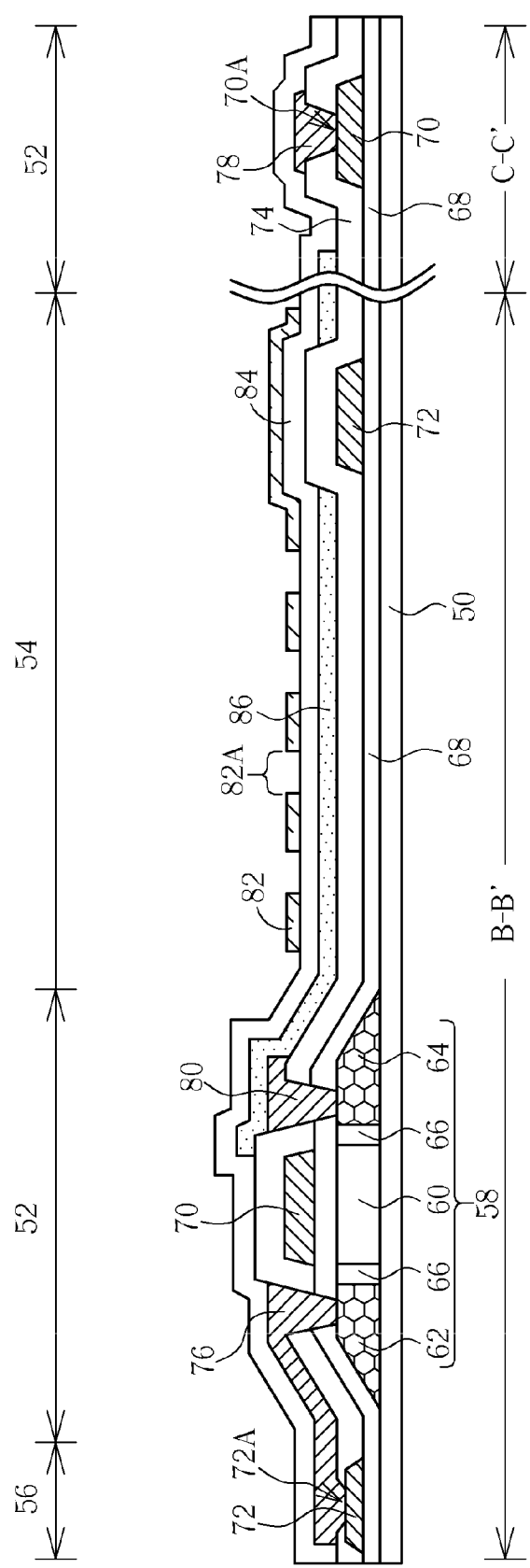

Please refer to FIGS. 13-14. FIGS. 13-14 are schematic diagrams illustrating of a pixel structure of an LCD panel according to another embodiment of the present invention. FIG. 13 is a top view of the pixel structure, and FIG. 14 is a cross-sectional view along tangent lines DD' and EE'. In the embodiment described below, similar parts will not redundantly described. As shown in FIGS. 13-14, the pixel electrode 86 is disposed between the second insulating layer 74 and the third insulating layer 84, while the common electrode 82 is disposed on the third insulating layer 84. In another word, the pixel electrode 86 is disposed under the common electrode 82. In addition, the pixel electrode 86 is disposed on and in direct contact with the drain pad 80, and the pixel electrode 86 has an intact surface in the display region 54. The common electrode 82 includes a plurality of slits 82A. Also, the common electrode 82 crosses through the data line 72, and thus the common electrode 82 and the data line 72 are partially overlapping.

Figure 15:
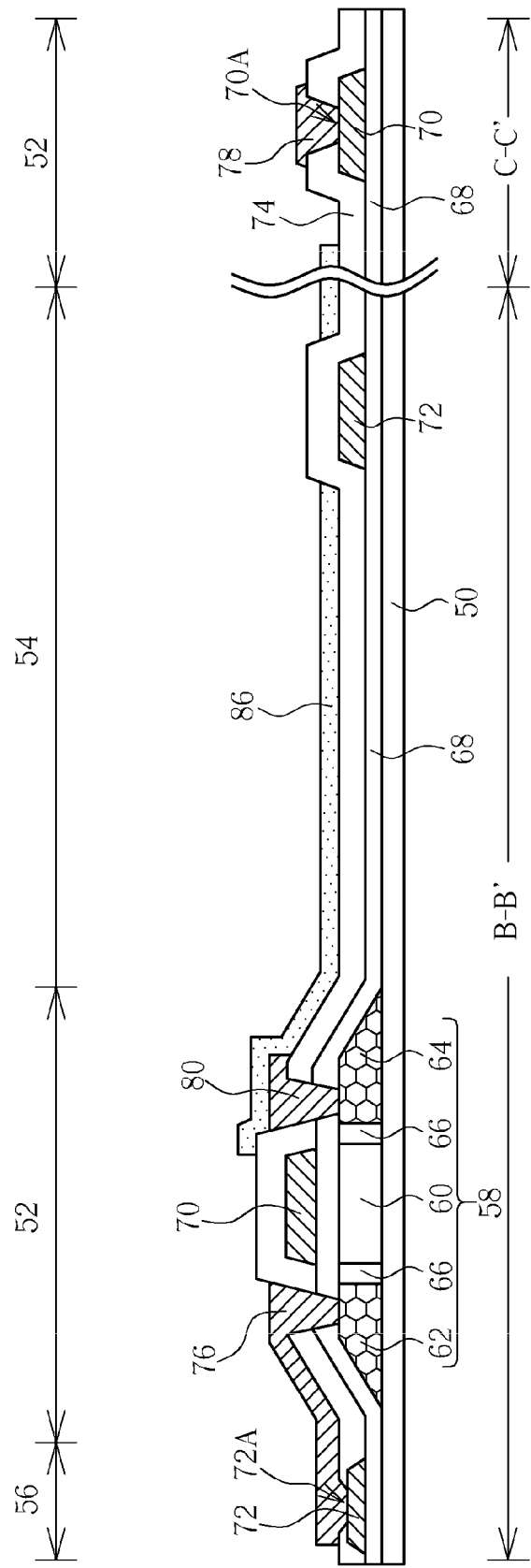
FIGS. 15-17 are schematic diagrams illustrating a method of forming the pixel structure shown in FIGS. 13-14.
Figure 16:
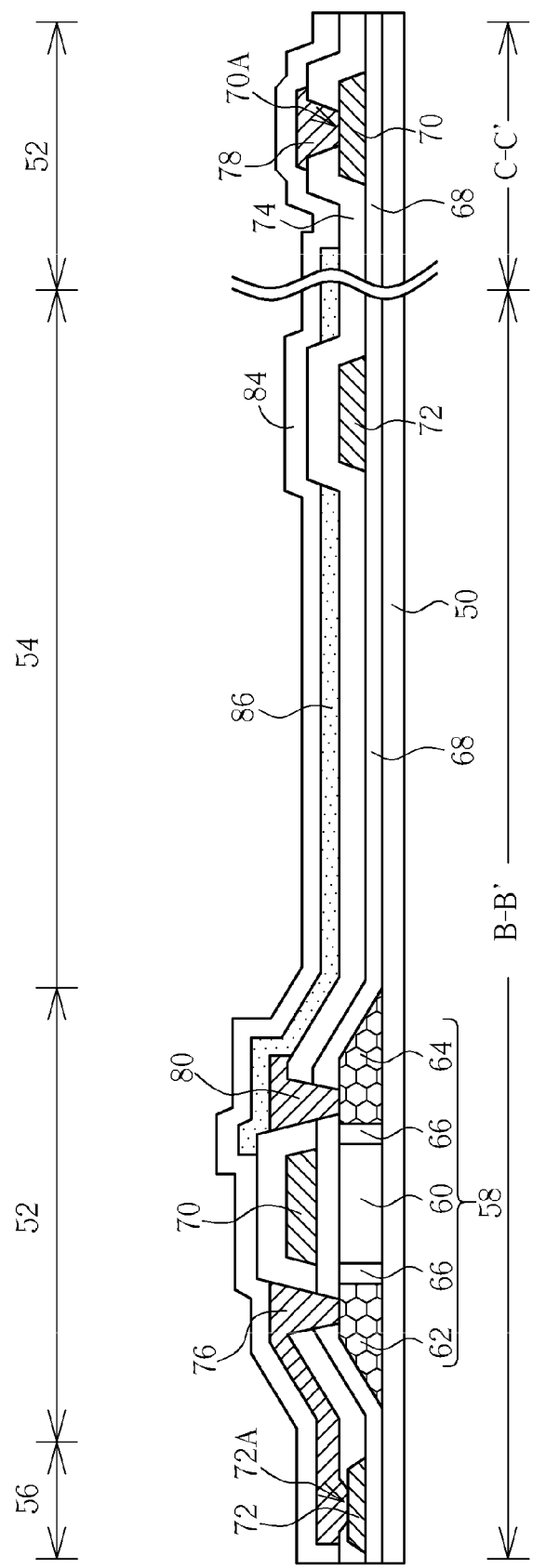
Figure 17:
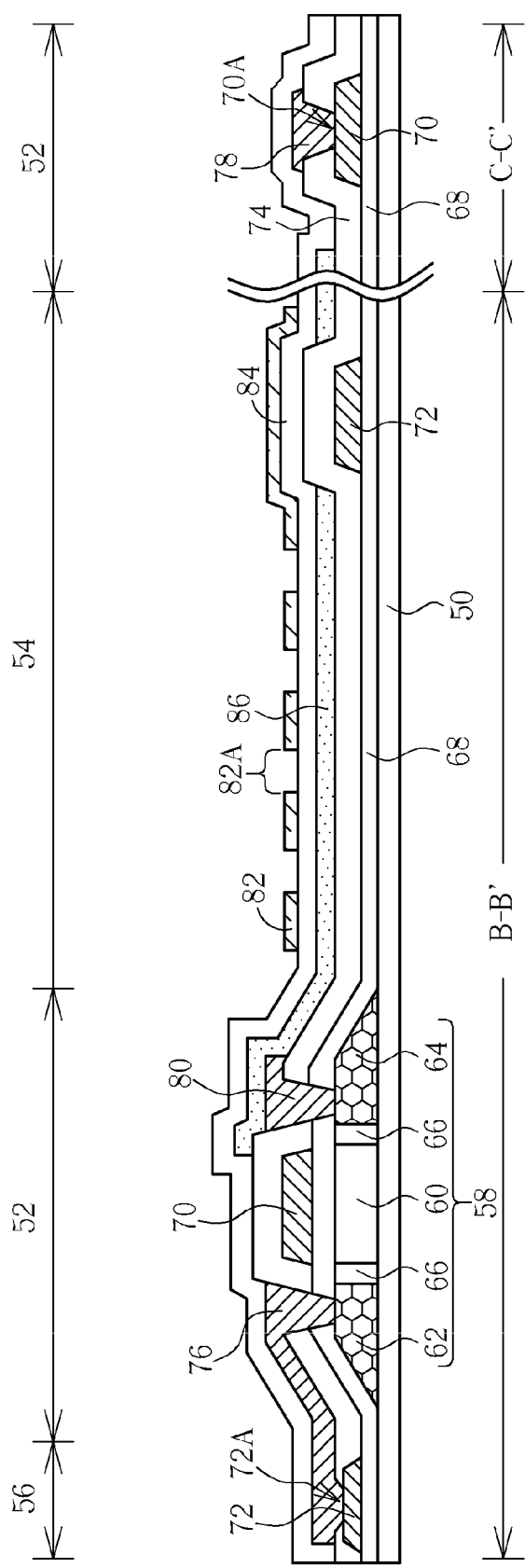

FIGS. 15-17 are schematic diagrams illustrating a method of forming the pixel structure shown in FIGS. 13-14. The process steps illustrated in FIGS. 15-17 are performed subsequent to the process steps illustrated in FIGS. 5-9, and therefore please refer FIGS. 15-17 and FIGS. 5-9 as well. As shown in FIG. 15, a pixel electrode 86 is formed on the second insulating layer 74. The pixel electrode 86 has an intact surface in the display region 54, and is in direct contact with the drain pad 80 so as to electrically connect to the drain pad 80. In this embodiment, the pixel electrode 86 does not overlap with the data line 72. As shown in FIG. 16, a third insulating layer 84 is formed on the second insulating layer 74 and the pixel electrode 86. As shown in FIG. 17, a common electrode 82 is formed on the third insulating layer 84, and the common electrode 82 is partially removed by photolithographic and etching techniques so that the common electrode 82 is defined in the display region 54 and includes a plurality of slits 82A.

In comparison with the conventional pixel structure, the pixel structure saves one insulating layer. Therefore, the present invention has the advantages of simplified structure and process, and improved light transmission without scarifying the aperture ratio.

Those skilled in the art will readily observe that numerous modifications and alterations of the device and method may be made while retaining the teachings of the invention.

What is claimed is:

1. A pixel structure of a liquid crystal display panel formed on a substrate, the substrate comprises a switch device region, a display region, and a peripheral region, the pixel structure comprising:
   a semiconductor layer disposed in the switch device region of the substrate, the semiconductor layer comprising a channel region, and a source region and a drain region disposed on two opposite sides of the channel region respectively;
   a first insulating layer disposed on the substrate, the first insulating layer covering the semiconductor layer and having two openings which expose the source region and the drain region respectively;
   a first patterned conductive layer disposed on the first insulating layer, the first patterned conductive layer comprising a gate electrode disposed on the first insulating layer and corresponding to the channel region of the semiconductor layer in the switch device region, and a data line disposed on the first insulating layer in the peripheral region, wherein a surface of the gate electrode includes a scan line connection region, and a surface of the data line includes a source connection region;
   a second insulating layer disposed on the first insulating layer, the gate electrode and the data line, the second insulating layer having four openings which expose the source region, the drain region, the scan line connection region of the gate, and the source connection region of the data line, respectively;
   a second patterned conductive layer disposed on the second insulating layer, the second patterned conductive layer comprising a data line connection electrode electrically connected to the source region and the source connection region of the data line through the openings of the first insulating layer and the second insulating layer, a scan line electrically connected to the scan line connection region of the gate electrode through the opening of the second insulating layer, and a drain pad electrically connected to the drain region through the openings of the first insulating layer and the second insulating layer; and
   a liquid crystal driving electrode structure disposed on the second insulating layer in the display region, the liquid crystal driving electrode structure comprising a common electrode, a third insulating layer and a pixel electrode, wherein the pixel electrode is extended to the switch device region and electrically connected to the drain region through the drain pad.

2. The pixel structure of the liquid crystal display panel of claim 1, wherein the common electrode, the third insulating layer and the pixel electrode are from bottom to top sequentially disposed on the second insulating layer, and the third insulating layer has an opening corresponding to and exposing the drain pad so that the pixel electrode is electrically connected to the drain pad.

3. The pixel structure of the liquid crystal display panel of claim 2, wherein the pixel electrode comprises a plurality of slits.

4. The pixel structure of the liquid crystal display panel of claim 1, wherein the pixel electrode, the third insulating layer and the common electrode are from bottom to top disposed on the second insulating layer.

5. The pixel structure of the liquid crystal display panel of claim 4, wherein the common electrode comprises a plurality of slits.

6. The pixel structure of the liquid crystal display panel of claim 1, wherein the common electrode comprises a transparent electrode.

7. The pixel structure of the liquid crystal display panel of claim 1, wherein the common electrode and the data line are partially overlapping.

8. The pixel structure of the liquid crystal display panel of claim 1, wherein the common electrode and the pixel electrode are partially overlapping, and composing a storage capacitor with the third insulating layer disposed therebetween.

9. The pixel structure of the liquid crystal display panel of claim 1, wherein the pixel electrode and the data line are not overlapping.

10. A method of forming a pixel structure of a liquid crystal display panel, comprising:
    providing a substrate having a switch device region, a display region, and a peripheral region defined thereon, the substrate comprising:
        a semiconductor layer disposed in the switch device region of the substrate;
        a source region and a drain region disposed on two opposite sides of the semiconductor layer respectively;
        a first insulating layer disposed on the substrate, the first insulating layer covering the semiconductor layer and having two openings which expose the source region and the drain region respectively;
    forming a first patterned conductive layer on the first insulating layer, the first patterned conductive layer comprising a gate electrode disposed on the first insulating layer and corresponding to the semiconductor layer in the switch device region, and a data line disposed on the first insulating layer in the peripheral region, wherein a surface of the gate electrode includes a scan line connection region, and a surface of the data line includes a source connection region;
    forming a second insulating layer on the first insulating layer, the gate electrode and the data line, and forming four openings exposing the source region, the drain region, the scan line connection region of the gate, and the source connection region of the data line, respectively;
    forming a second patterned conductive layer on the second insulating layer, the second patterned conductive layer comprising a data line connection electrode electrically connected to the source region and the source connection region of the data line through the openings of the first insulating layer and the second insulating layer, a scan line electrically connected to the scan line connection region of the gate electrode through the opening of the second insulating layer, and a drain pad electrically connected to the drain region through the openings of the first insulating layer and the second insulating layer; and
    forming a liquid crystal driving electrode structure on the second insulating layer of the display region, wherein the liquid crystal driving electrode structure comprises a common electrode, a third insulating layer and a pixel electrode, and wherein the pixel electrode is extended to the switch device region for electrically connecting to the drain region through the drain pad.

11. The method of claim 10, wherein the steps of forming the liquid crystal driving electrode structure comprises:
    forming the common electrode on the second insulating layer;

forming the third insulating layer on the common electrode and the second insulating layer, and forming an opening in the third insulating layer corresponding to and exposing the drain pad; and forming the pixel electrode on the third insulating layer, and electrically connecting the pixel electrode to the drain pad through the opening of the third insulating layer.

12. The method of claim 11, wherein the steps of forming the pixel electrode further comprise partially removing the pixel electrode to form a plurality of slits.

13. The method of claim 10, wherein the steps of forming the liquid crystal driving electrode structure comprise:

forming the pixel electrode on the second insulating layer, and electrically connecting the pixel electrode to the drain pad;

forming the third insulating layer on the pixel electrode and the second insulating layer; and forming the common electrode on the third insulating layer.

14. The method of claim 13, wherein the steps of forming the common electrode further comprise partially removing the common electrode to form a plurality of slits.

* * * * *